US010524374B2

(12) United States Patent
Tsutsui et al.

(10) Patent No.: US 10,524,374 B2
(45) Date of Patent: Dec. 31, 2019

(54) ELECTRIC DEVICE

(71) Applicants: Toyota Jidosha Kabushiki Kaisha, Toyota-shi, Aichi-ken (JP); Denso Corporation, Kariya-shi, Aichi-ken (JP)

(72) Inventors: Shoji Tsutsui, Suzuka (JP); Hiroki Umeda, Toyota (JP); Masatoshi Shinohara, Toyota (JP); Keisuke Hata, Toyota (JP); Daisuke Harada, Kariya (JP)

(73) Assignees: Toyota Jidosha Kabushiki Kaisha, Toyota-shi, Aichi-ken (JP); Denso Corporation, Kariya-shi, Aichi-ken (JP)

( * ) Notice: Subject to any disclaimer, the term of this patent is extended or adjusted under 35 U.S.C. 154(b) by 0 days.

(21) Appl. No.: 16/296,730

(22) Filed: Mar. 8, 2019

(65) Prior Publication Data
US 2019/0281722 A1    Sep. 12, 2019

(30) Foreign Application Priority Data
Mar. 12, 2018   (JP) .................................. 2018-044148

(51) Int. Cl.
| H05K 7/14 | (2006.01) |
| F16B 43/00 | (2006.01) |
| H05K 5/02 | (2006.01) |
| H05K 7/12 | (2006.01) |
| F16B 5/02 | (2006.01) |

(52) U.S. Cl.
CPC ............ *H05K 7/1417* (2013.01); *F16B 5/02* (2013.01); *F16B 43/00* (2013.01); *H05K 5/0204* (2013.01); *H05K 7/12* (2013.01); *H05K 7/1407* (2013.01)

(58) Field of Classification Search
None
See application file for complete search history.

(56) References Cited

U.S. PATENT DOCUMENTS

| 7,120,030 B2 * | 10/2006 | Azumi | ................ B60R 16/0239 361/752 |
| 10,206,309 B2 * | 2/2019 | Yang | .................... H05K 5/0047 |
| 2011/0228498 A1 * | 9/2011 | Kawai | ................ H05K 7/20409 361/752 |

(Continued)

FOREIGN PATENT DOCUMENTS

| JP | H09266388 A | 10/1997 |
| JP | 2007-329413 A | 12/2007 |

(Continued)

*Primary Examiner* — Xanthia C Cunningham
(74) *Attorney, Agent, or Firm* — Dinsmore & Shohl LLP

(57) ABSTRACT

An electric device includes a substrate on which electronic components are mounted, and a metal plate to which the substrate is fixed. The metal plate includes first bosses provided at positions corresponding to four corners of the substrate, a second boss provided inside a rectangle that connects the four first bosses, and a slit that is provided adjacent to the second boss, and extends in non-parallel with any side of the rectangle. The substrate is fixed to each of the four first bosses with a first male screw, such that a rubber washer is sandwiched between the substrate and the first male screw. The substrate is fixed to the second boss with a second male screw, such that no rubber washer is sandwiched between the substrate and the second male screw.

7 Claims, 6 Drawing Sheets

(56) References Cited

U.S. PATENT DOCUMENTS

| | | | |
|---|---|---|---|
| 2015/0103287 A1* | 4/2015 | Saitou | B60R 11/02 349/58 |
| 2016/0131178 A1* | 5/2016 | Shiba | H05K 7/1418 411/368 |
| 2018/0216643 A1* | 8/2018 | Sone | F16B 5/0216 |

FOREIGN PATENT DOCUMENTS

| | | |
|---|---|---|
| JP | 2012-075277 A | 4/2012 |
| JP | 2014-240675 A | 12/2014 |
| WO | 2014/199205 A1 | 12/2014 |

\* cited by examiner

ELECTRIC DEVICE

CROSS-REFERENCE TO RELATED APPLICATIONS

This application claims priority to Japanese Patent Application No. 2018-044148 filed on Mar. 12, 2018, which is incorporated herein by reference in its entirety.

BACKGROUND

1. Technical Field

The technology disclosed in this specification relates to an electric device having a substrate on which electronic components are mounted, and a metal plate to which the substrate is fixed.

2. Description of Related Art

In an electric device, it is common to fix a substrate on which electronic components are mounted, to a metal plate. A typical example of the metal plate to which the substrate is fixed is a bottom plate of a case of the electric device, or a partition plate inside the case. If the metal plate and the substrate are rigidly fixed with a plurality of male screws, high stress may be generated in the substrate, due to a difference in the linear coefficient of expansion. Some technologies for mitigating the stress generated in the substrate due to a difference in the linear coefficient of expansion are disclosed in Japanese Unexamined Patent Application Publications No. 2014-240675, No. 09-266388, and No. 2007-329413 (JP 2014-240675 A, JP 09-266388 A, JP 2007-329413 A).

JP 2014-240675 A discloses an inverter in which a substrate is fixed to a metal plate within a case with male screws. The metal plate is provided with first bosses at positions corresponding to four corners of the substrate, and second bosses inside a rectangle that connects the four first bosses. The substrate is fixed to each of the first bosses and second bosses with a male screw, via a rubber washer. In operation, the rubber washers as electric bodies are deformed, so that stress generated in the substrate due to a difference in the linear coefficient of expansion between the metal plate and the substrate is mitigated. One of the second bosses inside the rectangle and the substrate may be rigidly fixed with a male screw, without sandwiching a rubber washer between the substrate and the male screw, as described in JP 2014-240675 A.

According to the technology disclosed in JP 09-266388 A, a plurality of bosses is provided on a chassis (metal plate) of an electric device, and a substrate is fixed to the bosses with male screws. U-shaped slits are provided around the bosses of the chassis. In operation, portions of the chassis surrounded by the U-shaped slits are elastically deformed, so that stress generated in a substrate due to a difference in the linear coefficient of expansion between the metal plate and the substrate is mitigated.

In an electric device disclosed in JP 2007-329413 A, a plurality of bosses is provided on a metal plate, and a substrate is fixed to the bosses with male screws. The metal plate is provided with slits. Since the rigidity of the metal plate is reduced at around the slits, stress generated in the substrate due to a difference in the linear coefficient of expansion between the metal plate and the substrate is mitigated.

SUMMARY

This specification provides a technology for effectively mitigating stress generated in a substrate due to a difference in the linear coefficient of expansion between a metal plate and the substrate, to be lower than that in the related art.

According to this specification, an electric device including a substrate on which an electronic component is mounted, and a metal plate to which the substrate is fixed, is provided. The metal plate includes first bosses provided at positions corresponding to four corners of the substrate, a second boss provided inside a rectangle that connects the first bosses, and a slit provided adjacent to the second boss. The slit extends in non-parallel with any side of the rectangle. The substrate is fixed to each of the first bosses with a first male screw, such that a rubber washer is sandwiched between the substrate and the first male screw. The substrate is fixed to the second boss with a second male screw, such that no rubber washer is sandwiched between the substrate and the second male screw. In this electric device, the substrate is rigidly fixed to the second boss with the second male screw within the rectangle. On the other hand, the rigidity of a region of the metal plate surrounding the second boss is reduced, due to the presence of the slit provided adjacent to the second boss. Thus, stress generated around the second boss due to a difference in the linear coefficient of expansion between the substrate and the metal plate is mitigated when the metal plate is deformed so that the second boss is inclined. Further, since the slit extends in non-parallel with any side of the rectangle, the second boss is likely to be inclined in a diagonal direction of the rectangle. The substrate, which is fixed at four corners, is distorted most in diagonal directions. Since the second boss is more likely to be inclined in the diagonal direction, stress generated in the substrate in the vicinity of the second boss can be effectively mitigated. At the same time, since the four corners of the substrate are fixed to the first bosses via rubber washers, stress generated in the substrate in the vicinity of the first bosses can be mitigated through deformation of the rubber washers as elastic bodies. In the electric device disclosed in this specification, the substrate is fixed to the first bosses at the four corners of the substrate via the rubber washers, and is fixed to the second boss provided with an adjacent slit but not using a rubber washer, so that stress generated in the substrate due to a difference in the linear coefficient of expansion can be effectively mitigated. Therefore, small rubber washers can be employed, and a sufficiently large area for installation of components can be ensured on the substrate.

The metal plate may include a plurality of slits that extends in parallel with each other, such that the second boss is interposed between the slits. With this arrangement, the rigidity of the metal plate in the vicinity of the second boss can be further reduced, and the second boss is made more likely to be inclined.

In the electric device, the second boss adjacent to the slits may be located in a middle of the rectangle that connects the first bosses corresponding to the four corners of the substrate.

A rib having a height that increases in directions away from the second boss may be provided on a back surface of a portion of the metal plate which is interposed between the slits. With the rib thus provided, the second boss can be kept likely to be inclined, and the rigidity of a portion of the metal plate which supports the second boss, as measured in the normal direction, can be increased. Thus, the vibration resistance of the substrate is improved.

In the electric device, the metal plate may be a part of a case of the electric device, and may be connected at a periphery of the metal plate to side plates of the case of the electric device. In this case, the metal plate may include a third boss, and a U-shaped slit provided between the third boss and one of the side plates which is closest to the third boss, so as to partially surround the third boss, and the substrate may be fixed to the third boss with a third male screw. With the U-shaped slit thus provided, the third boss can be made more likely to be inclined, without being influenced by the rigidity of the side plate.

In the electric device, the metal plate may include a hole, and a fourth boss may be provided at an edge of the hole. The substrate may be fixed to the fourth boss with a fourth male screw. Since the hole makes it easier to incline the fourth boss, like the slit as described above, stress generated in the substrate in the vicinity of the fourth boss can be mitigated. As the hole provided at its edge with the fourth boss, a hole through which a signal line is passed may be used.

Details of the technology disclosed in this specification, and further improvements, will be described in "DETAILED DESCRIPTION OF THE EMBODIMENTS".

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
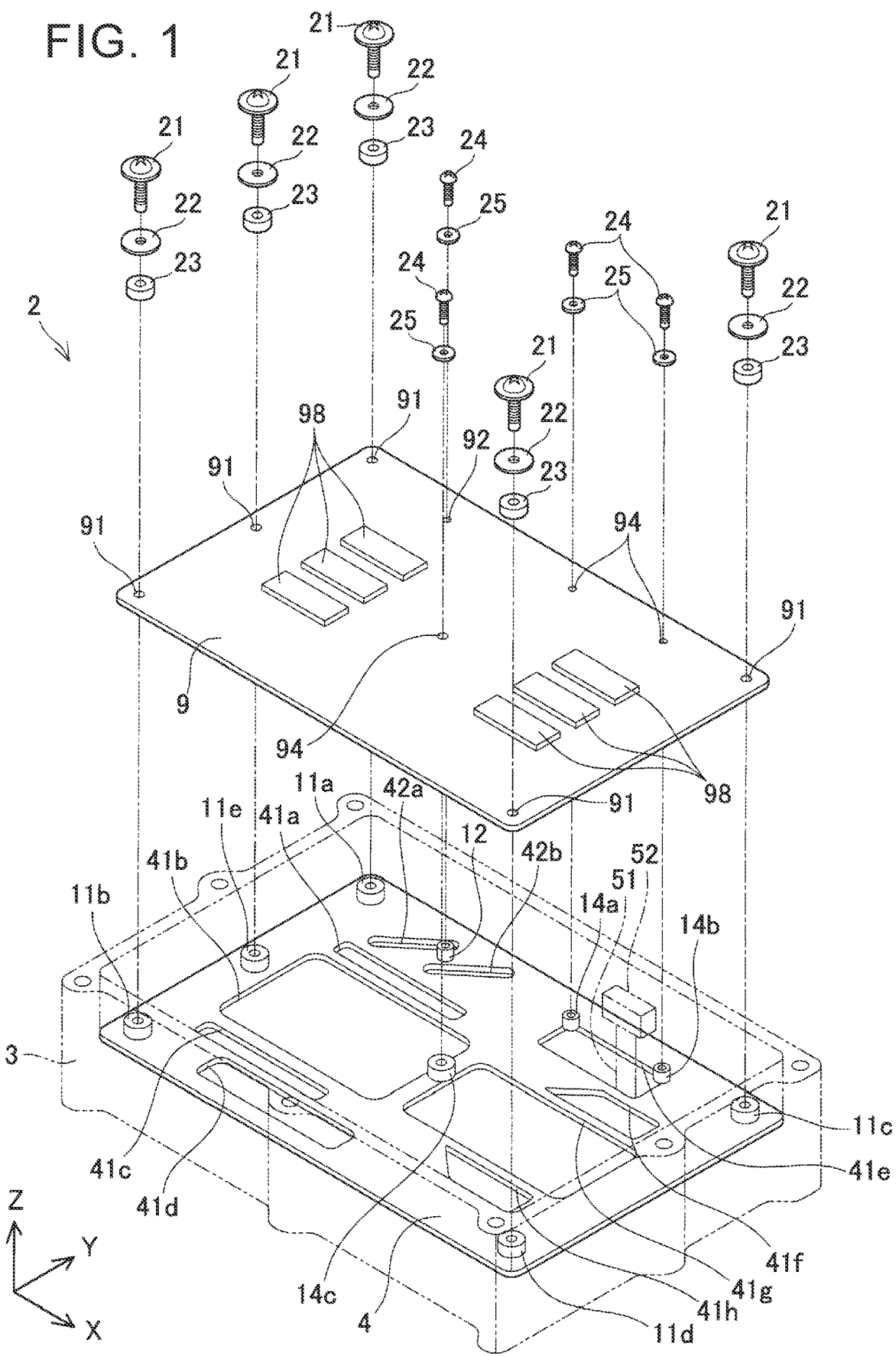
FIG. 1 is a perspective view of an electric device of a first embodiment of this disclosure.
Figure 2:
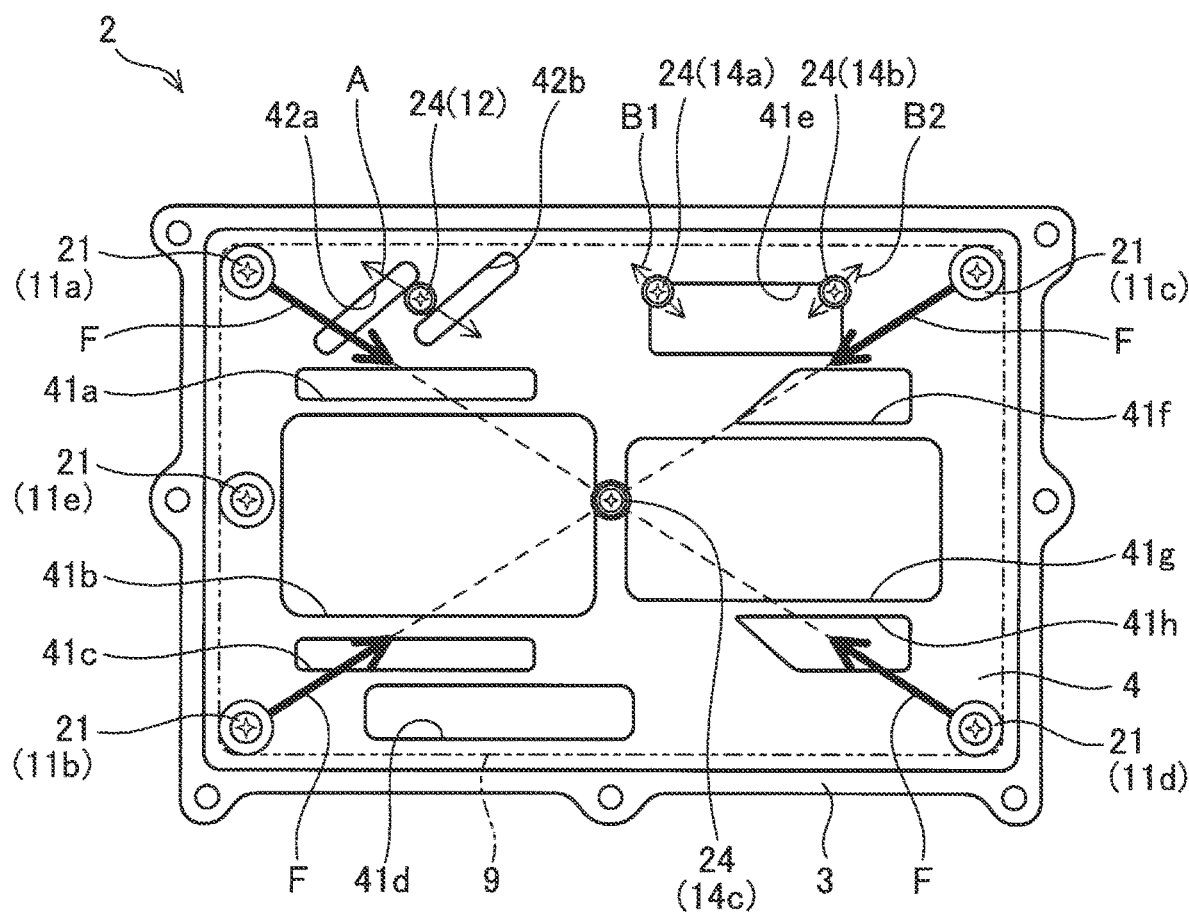
FIG. 2 is a plan view of the electric device of the first embodiment.

Referring to FIG. 1 and FIG. 2, an electric device 2 of a first embodiment will be described. FIG. 1 is an exploded perspective view of the electric device 2, and FIG. 2 is a plan view of the electric device 2. The electric device 2 is a power control unit installed on an electric vehicle. The electric device 2 is operable to convert electric power of a vehicle-mounted battery, to electric power for driving a running motor.

The electric device 2 has an upper case 3, and a lower case (not shown), but only the upper case 3 is depicted in FIG. 1. FIG. 1 shows a condition where an upper cover (not shown) is removed, and a substrate 9 is detached from the upper case 3. In FIG. 1, the upper case 3 is depicted with virtual lines, so as to provide a good view of a metal plate 4 to which the substrate 9 is fixed. Various components other than the substrate 9 are housed in the case of the electric device 2, but these components are not illustrated in the drawings. In FIG. 2, the substrate 9 is depicted with virtual lines, so as to provide a good view of the metal plate 4 below the substrate 9.

The metal plate 4 is a partition plate that separates the internal space of the upper case 3 into upper and lower sections. The metal plate 4 is connected to four side plates of the upper case 3. The substrate 9 is fixed onto the metal plate 4. A power module, current sensor, etc. for use in power conversion are housed in space under the metal plate 4. Various electronic components 98 are mounted on the substrate 9. The electronic components 98 are mounted on a surface of the substrate 9, and printed wiring for electrically connecting the electronic components 98 is also drawn on the surface, though the printed wiring is not illustrated in the drawings. The various electronic components 98 constitute a control circuit that controls the power module.

The control circuit constituted by the electronic components 98 mounted on the substrate 9 receives sensor data from the current sensor (not shown) disposed below the metal plate 4, and controls the power module based on the sensor data. The metal plate 4 is provided with holes 41$a$, 41$b$, 41$c$, 41$d$, 41$e$, 41$f$, 41$g$, 41$h$. Signal lines that extend from devices disposed below the metal plate 4 pass through the holes 41$a$, 41$b$, 41$c$, 41$d$, 41$e$, 41$f$, 41$g$, 41$h$, and are connected to the substrate 9. In FIG. 1, as one example, a signal line 51 that passes through the hole 41$e$ is depicted with virtual lines. A connector 52 is attached to the upper end of the signal line 51, and the connector 52 is connected to the substrate 9. Some of the holes 41$a$, 41$b$, 41$c$, 41$d$, 41$e$, 41$f$, 41$g$, 41$h$ may be provided for reducing the weight, and signal lines may not pass through these holes.

The substrate 9 is fixed to the metal plate 4 with a plurality of male screws 21, 24. The metal plate 4 is made of aluminum, and the substrate 9 is made of resin. Aluminum and resin have different linear coefficients of expansion; therefore, if the substrate 9 is rigidly fixed to the metal plate 4, large stress may be generated in the substrate 9 when the metal plate 4 and the substrate 9 thermally expand, and the substrate 9 may be damaged. In the electric device 2, the substrate 9 is fixed to the metal plate 4, such that stress generated in the substrate 9 due to a difference in the linear coefficient of expansion is reduced.

The metal plate 4 is provided with bosses 11$a$, 11$b$, 11$c$, 11$d$, 11$e$, 12, 14$a$, 14$b$, 14$c$ that protrude in the normal direction of the plane of the plate. The bosses 11$a$, 11$b$, 11$c$, 11$d$, 11$e$, 12, 14$a$, 14$b$, 14$c$ are cylindrical projections for fixing the substrate 9 with male screws. Internally threaded holes are formed in top faces of the bosses 11$a$, 11$b$, 11$c$, 11$d$, 11$e$, 12, 14$a$, 14$b$, 14$c$. The substrate 9 is fixed to the bosses 11$a$, 11$b$, 11$c$, 11$d$, 11$e$ with male screws 21, and is fixed to the bosses 12, 14$a$, 14$b$, 14$c$ with male screws 24.

The bosses 11$a$, 11$b$, 11$c$, 11$d$ are provided at positions corresponding to four corners of the substrate 9 having a rectangular shape. The boss 11$e$ is provided on a line connecting the boss 11$a$ with the boss 11$b$. The substrate 9 is fixed to the bosses 11$a$, 11$b$, 11$c$, 11$d$, 11$e$ with the male screws 21 such that a rubber washer 23 and a metal washer 22 are sandwiched between each of the male screws 21 and the substrate 9. The male screws 21 pass through through-holes 91 provided in the substrate 9, to be fixed to the bosses 11$a$, 11$b$, 11$c$, 11$d$, 11$e$.

As the temperatures of the substrate 9 and the metal plate 4 rise, the substrate 9 and the metal plate 4 respectively undergo thermally expansion. The amount of thermal deformation of the substrate 9 is different from that of the metal plate 4, due to a difference between the linear expansion coefficient of the substrate 9 and that of the metal plate 4, and stress is generated in the substrate 9 due to the difference. However, the rubber washers 23 as elastic bodies are sandwiched between the substrate 9 and the male screws 21 corresponding to the bosses 11a, 11b, 11c, 11d, 11e of the metal plate 4, respectively. As the rubber washers 23 are deformed, the stress generated in the substrate 9 is mitigated. The diameter of the through-holes 91 is larger than the diameter of the male screws 21, thus permitting misalignment of each of the bosses 11a, 11b, 11e, 11d, 11e and a corresponding one of the through-holes 91.

The bosses 12, 14a, 14b, 14c are located inside a rectangle that connects the four bosses 11a, 11b, 11e, 11d corresponding to the four corners of the substrate 9. The substrate 9 is fixed to the bosses 12, 14a, 14b, 14c with the male screws 24, such that only metal washers 25 are sandwiched between the respective male screws 24 and the substrate 9, and no rubber washers 23 are sandwiched therebetween. The male screws 24 pass through through-holes 92, 94 formed in the substrate 9, to be fixed to the bosses 12, 14a, 14b, 14c. The male screw 24 corresponding to the boss 12 passes through the through-hole 92 formed in the substrate 9, to be fixed to the boss 12. The male screws 24 corresponding to the bosses 14a, 14b, 14c, respectively, pass through the through-holes 94 formed in the substrate 9, to be fixed to the bosses 14a, 14b, 14c, respectively.

The metal plate 4 is provided with slits 42a, 42b. The slits 42a, 42b are located adjacent to the boss 12. The slits 42a, 42b extend in parallel with each other such that the boss 12 is interposed between the slits 42a, 42b. The slits 42a, 42b extend in non-parallel with any side of the rectangle connecting the four bosses 11a, 11b, 11c, 11d corresponding to the four corners of the substrate 9. Since the slits 42a, 42b are formed in the metal plate 4 in the vicinity of the boss 12, the rigidity of a portion (a region interposed between the slits 42a, 42b) of the metal plate 4 around the boss 12 is reduced. Thus, the boss 12 is likely to be inclined in directions (directions of arrow A in FIG. 2) intersecting with the direction in which the slits 42a, 42b extend. With the above arrangement in which no rubber washer is sandwiched between the male screw 24 and the substrate 9, as the ambient temperature rises, misalignment may appear between the boss 12 and the through-hole 92 of the substrate 9, due to a difference in the linear expansion coefficient, and stress may be generated in the substrate 9 in the vicinity of the boss 12. However, the metal plate 4 deforms in the vicinity of the boss 12 so as to permit the boss 12 to be inclined, and stress generated in the substrate 9 is mitigated.

The substrate 9 is fixed at its four corners, and therefore, large stress is likely to be generated in diagonal directions, due to a difference in the linear coefficient of expansion between the substrate 9 and the metal plate 4. In FIG. 2, broken lines indicate the diagonal directions, and thick arrows F in FIG. 2 indicate directions in which stress is likely to be large. Due to the presence of the slits 42a, 42b, the boss 12 is likely to be inclined in directions of arrow A which are substantially the same directions as the thick arrows F. Thus, the provision of the slits 42a, 42b makes it possible to effectively mitigate stress that may be generated in the substrate 9 in the vicinity of the boss 12.

The bosses 14a, 14b are provided at an edge of the hole 41e formed in the metal plate 4. The rigidity of the metal plate 4 in the vicinity of the bosses 14a, 14b is reduced, due to the presence of the hole 41e, as in the case where the rigidity of the metal plate 4 in the vicinity of the boss 12 is reduced, due to the presence of the slits 42a, 42b. Therefore, the bosses 14a, 14b are likely to be inclined. The boss 14a is likely to be inclined in directions (directions of arrow B1 in FIG. 2) perpendicular to the edge of the hole 41e at which the boss 14a is provided. The boss 14b is likely to be inclined in directions (directions of arrow B2 in FIG. 2) perpendicular to the edge of the hole 41e at which the boss 14b is provided. Since the bosses 14a, 14b are provided at the edge of the hole 41e, the bosses 14a, 14b that fix the substrate 9 are likely to be inclined, and stress generated in the substrate 9 due to a difference in the linear expansion coefficient is mitigated. Similarly, the boss 14c is provided at edges of the holes 41b, 41g, so that stress of the substrate 9 in the vicinity of the boss 14c is mitigated. Thus, in the electric device 2, it is possible to mitigate stress that may be generated in the substrate fixed to the metal plate 4, by making effective use of the holes through which signal lines are passed.

Figure 3:
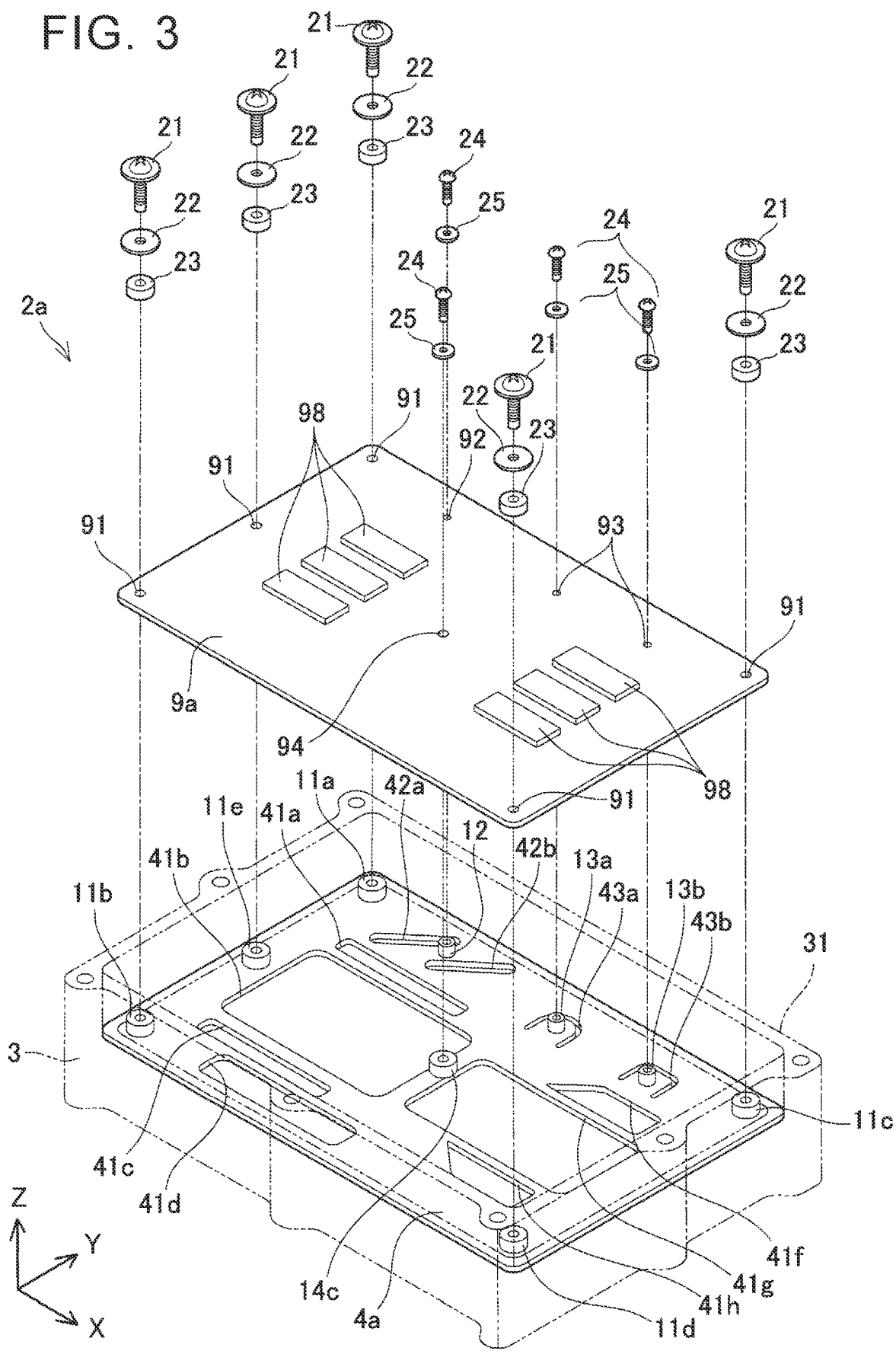
FIG. 3 is a perspective view of an electric device of a second embodiment.

Referring to FIG. 3, an electric device 2a of a second embodiment will be described. FIG. 3 is a perspective view of the electric device 2a. In FIG. 3, too, the upper case 3 is depicted with virtual lines, and a substrate 9a is illustrated such that it is separated from a metal plate 4a.

The electric device 2a of the second embodiment is different from the electric device 2 of the first embodiment, in that the electric device 2a has bosses 13a, 13b, and U-shaped slits 43a, 43b. In FIG. 3, the reference numerals for some of the same components as those of the electric device 2 of the first embodiment are omitted.

The substrate 9a is fixed to the metal plate 4a with a plurality of male screws 21, 24. The male screws 21 pass through the through-holes 91 formed in the substrate 9a, and are fixed to the bosses 11a, 11b, 11c, 11d, 11e, such that the metal washer 22 and rubber washer 23 are sandwiched between the substrate 9a and each of the male screws 21 corresponding to the bosses 11a, 11b, 11c, 11d, 11e. The male screws 24 corresponding to the bosses 13a, 13b pass through through-holes 93 formed in the substrate 9, and are fixed to the bosses 13a, 13b, such that the metal washer 25 is sandwiched between the substrate 9 and each of the male screws 24.

The metal plate 4a is provided with the bosses 13a, 13b and the U-shaped slits 43a, 43b. The bosses 13a, 13b are located inside the rectangle connecting the bosses 11a, 11b, 11c, 11d corresponding to the four corners of the substrate 9, as viewed in the plane of the metal plate 4a. The U-shaped slit 43a is located adjacent to the boss 13a. The U-shaped slit 43a is provided between the boss 13a and a side plate 31 located closest to the boss 13a, as one of side plates of the upper case 3, such that the boss 13a is partially surrounded by the U-shaped slit 43a. In other words, a bottom portion of the U shape of the U-shaped slit 43a is located between the boss 13a and the side plate 31, and the whole of the U-shaped slit 43a is arranged to partially surround the boss 13a. With the U-shaped slit 43a thus provided, the rigidity of a portion of the metal plate 4a around the boss 13a (a portion inside the U-shaped slit 43a) is reduced, without being influenced by the hard side plate 31. Due to the presence of the U-shaped slit 43a, the boss 13a is likely to be inclined, and stress generated in the substrate 9a in the vicinity of the boss 13a due to a difference in the linear expansion coefficient can be mitigated.

The U-shaped slit 43b is located adjacent to the boss 13b. The U-shaped slit 43b is provided between the boss 13b and the side plate 31 located closest to the boss 13b, as one of the side plates of the upper case 3, such that the boss 13b is partially surrounded by the U-shaped slit 43b. In other words, a bottom portion of the U shape of the U-shaped slit 43b is located between the boss 13b and the side plate 31, and the whole of the U-shaped slit 43b is arranged to partially surround the boss 13b. Due to the presence of the U-shaped slit 43b, like the U-shaped slit 43a, stress generated in the substrate 9a in the vicinity of the boss 13b due to a difference in the linear expansion coefficient can be mitigated.

Figure 4:
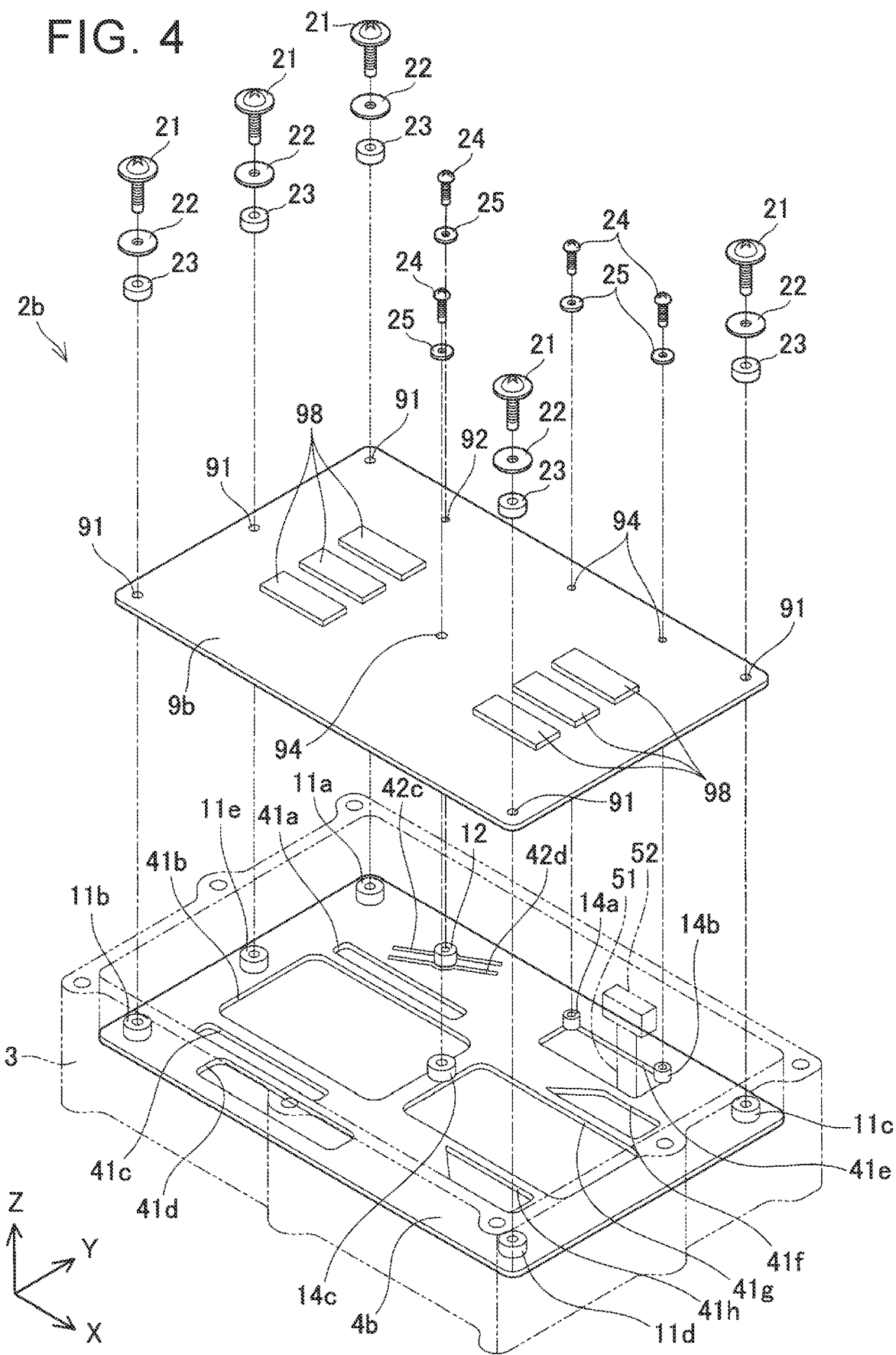
FIG. 4 is a perspective view of an electric device of a third embodiment.
Figure 5:
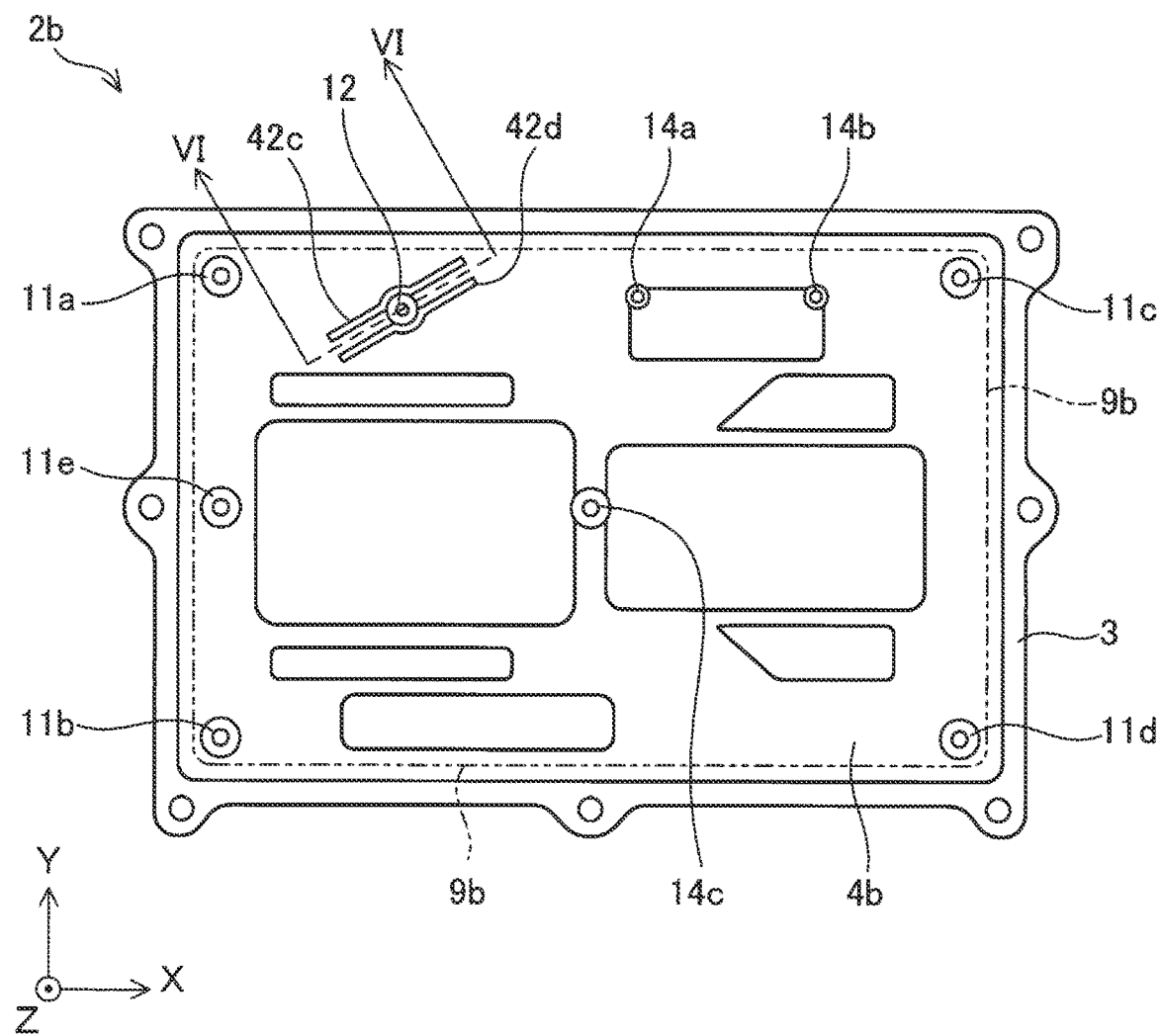
FIG. 5 is a plan view of the electric device of the third embodiment.

Referring to FIG. 4 through FIG. 7, an electric device 2b of a third embodiment will be described. FIG. 4 is a perspective view of the electric device 2b of the third embodiment. In FIG. 4, too, the upper case 3 is depicted with virtual lines, and a substrate 9b is illustrated such that it is separated from a metal plate 4b. FIG. 5 is a plan view of the electric device 2b from which an upper cover is removed. In FIG. 5, the substrate 9b is depicted with virtual lines. In FIG. 5, male screws fixed to the respective bosses 11a, 11b, 11c, 11d, 11e, 12, 14a, 14b, 14c are not illustrated.

The electric device 2b of the third embodiment is different from the electric device 2 of the first embodiment in that the shapes of slits 42c, 42d provided on opposite sides of the boss 12 are different from those of the slits 42a, 42b of the electric device 2. Also, a rib is provided on the back side of a portion of the metal plate 4b interposed between the slits 42c, 42d, as will be described later. Except for these points, the electric device 2b of the third embodiment is identical with the electric device 2 of the first embodiment. In FIG. 4 and FIG. 5, the reference numerals for some of the same components as those of the electric device 2 of the first embodiment are omitted.

The substrate 9b is fixed to the metal plate 4b with a plurality of male screws 21, 24. The male screws 21 pass through the through-holes 91 formed in the substrate 9b, and are fixed to the bosses 11a, 11b, 11c, 11d, 11e, respectively, such that the metal washer 22 and rubber washer 23 are sandwiched between the substrate 9b and each of the male screws 21 corresponding to the bosses 11a, 11b, 11c, 11d, 11e. The male screw 24 corresponding to the boss 12 passes through the through-hole 92 formed in the substrate 9b, and is fixed to the boss 12 such that the metal washer 25 is sandwiched between the substrate 9b and the male screw 24. The male screws 24 corresponding to the bosses 14a, 14b, 14c pass through the through-holes 94 formed in the substrate 9b, and are fixed to the bosses 14a, 14b, 14c, such that the metal washer 25 is sandwiched between the substrate 9b and each of the male screws 24 corresponding to the bosses 14a, 14b. 14c. The bosses 12, 14a, 14b, 14c are located inside a rectangle connecting the bosses 11a, 11b, 11c, 11d corresponding to the four corners of the substrate 9b, as viewed in the plane of the metal plate 4b.

The slits 42c, 42d are located adjacent to the boss 12. The slits 42c, 42d are disposed in parallel with each other, such that the boss 12 is interposed between the slits 42c, 42d. The slits 42c, 42d are disposed in non-parallel with any side of the rectangle connecting the bosses 11a, 11b, 11c, 11d corresponding to the four corners of the substrate 9b. In these points, the slits 42c, 42d are the same as the slits 42a, 42b provided in the electric device 2 of the first embodiment. Therefore, like the slits 42a, 42b, the provision of the slits 42c, 42d makes it possible to effectively mitigate stress that may be generated in the substrate 9b in the vicinity of the boss 12.

Figure 6:
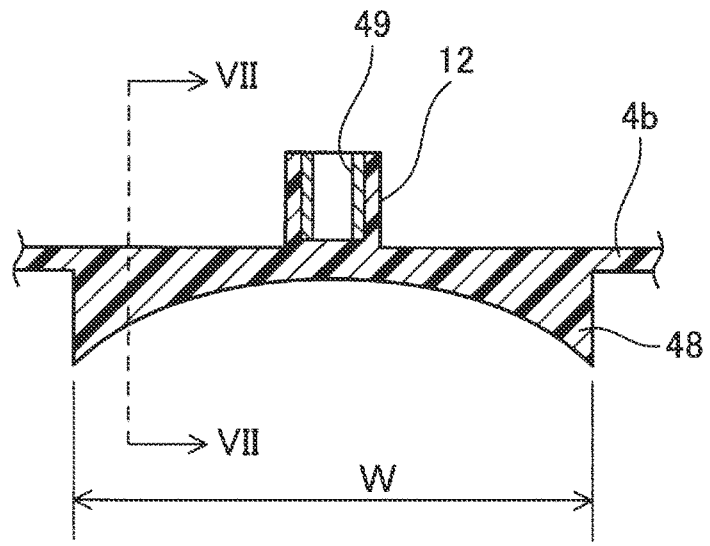
FIG. 6 is a cross-sectional view taken along line VI-VI in FIG. 5.
Figure 7:
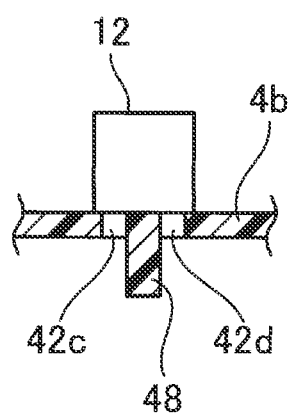
FIG. 7 is a cross-sectional view taken along line VII-VII in FIG. 6.

The slits 42c, 42d are located closer to the boss 12, than the slits 42a, 42b of the electric device 2 of the first embodiment, and middle portions of the slits 42c, 42d as viewed in the longitudinal direction are curved, so as to circumvent the boss 12. Also, the rib is provided on the back side of a portion of the metal plate 4b which is interposed between the slits 42c, 42d. Here, the back side of the metal plate 4b means one side of the metal plate 4b opposite to its surface opposed to the substrate 9b. FIG. 6 is a cross-sectional view taken along line VI-VI of FIG. 5. FIG. 6 shows a section of a portion of the metal plate 4b which is interposed between the slits 42c, 42d. FIG. 7 is a cross-sectional view taken along line VII-VII of FIG. 6. As shown in FIG. 6 and FIG. 7, the rib 48 is provided on the back side of the portion of the metal plate 4b interposed between the slits 42c, 42d. The length W of the rib shown in FIG. 6 is equal to that of the slits 42c, 42d.

The height of the rib 48 increases in directions away from the boss 12 in the plane of the metal plate 4b. The provision of the rib 48 makes it possible to increase the rigidity of a portion of the metal plate 4b which supports the boss 12, as measured in the normal direction, while keeping the boss 12 likely to be inclined. Thus, the vibration resistance of the substrate is improved. A female screw 49 for fixing the male screw 24 is embedded inside the boss 12. Similarly, female screws are embedded in the other bosses 11a, 11b, 11c, 11d, 11e, 13a, 13b, 14a. 14b, 14c.

As described above, each of the electric devices 2, 2a, 2b of the embodiments includes a metal plate, and a substrate fixed to the metal plate. The metal plate is provided with the bosses 11a, 11b, 11c, 11d, which are located at positions corresponding to the four corners of the substrate. The substrate is fixed to the bosses 11a, 11b, 11c, 11d, with the rubber washers sandwiched between the substrate and the corresponding male screws 21. The rubber washers serve to mitigate stress that may be generated in the substrate around the bosses 11a, 11b, 11c, 11d due to a difference in the linear coefficient of expansion between the substrate and the metal plate. The substrate is also fixed to the other bosses 12, 13a, 13b, 14a, 14b, 14c. The other bosses 12, 13a, 13b, 14a, 14b, 14c are provided inside the rectangle connecting the bosses 11a, 11b, 11c, 11d. The substrate is fixed to the other bosses 12, 13a, 13b, 14a, 14b, 14c, with no rubber washers sandwiched between the substrate and the corresponding male screws 24. The slits 42a, 42b or slits 42c, 42d, U-shaped slits 43a, 43b, and holes 41b, 41g are provided adjacent to the other bosses 12, 13a, 13b, 14a, 14b, 14c. The slits 42a, 42b or slits 42c, 42d, U-shaped slits 43a, 43b, and holes 41b, 41g serve to mitigate stress that may be generated in the substrate around the bosses 12, 13a, 13b, 14a, 14b, 14c.

In the electric devices 2, 2a, 2b of the embodiments, the substrate is fixed with male screws, at some locations (the bosses 12, 13a, 13b, 14a, 14b, 14c) where no rubber washers are sandwiched between the substrate and the male screws, so that the proportion of areas of rubber washers to the area of the substrate can be reduced. As a result, the mounting area of components can be expanded.

Some points to note in connection with the technologies described above in the embodiments will be stated. The bosses 11a, 11b, 11c, 11d correspond to one example of the first bosses. The male screws 21 fixed to the bosses 11a, 11b, 11c, 11d correspond to one example of the first male screws. The boss 12 corresponds to one example of the second boss. The male screw 24 fixed to the boss 12 corresponds to one example of the second male screw. The bosses 13a, 13b correspond to one example of the third male screws. The bosses 14a, 14b, 14c correspond to one example of the fourth bosses. The male screws 24 fixed to the bosses 14a, 14b, 14c correspond to one example of the fourth male screws.

The second boss (boss 12) adjacent to the slits may be located in the middle of the rectangle connecting the first bosses 11a, 11b, 11c, 11d corresponding to the four corners of the substrate. Also, there is no limitation to the ratio of the longer side of the slits to the shorter side thereof. The technologies disclosed in this specification may also be applied to electric devices other than power converters.

Three or more slits may extend in parallel, and the second boss may be provided between any two of these slits.

Only one slit may be provided adjacent to the second boss, and a rib that extends along the slit may be provided on one side of the metal plate opposite to the second boss. The height of the rib increases in directions away from the second boss. No signal lines may pass through holes having the fourth bosses at their edges.

While some specific examples of the disclosure have been described in detail, these examples are merely exemplary, and are not meant to limit the appended claims. The technologies described in the claims include those obtained by modifying or changing the illustrated specific examples in various manners. Technical elements described in this specification or drawings exhibit technical usefulness when they are used alone or in various combinations, and are not limited to combinations described in the claims as filed. Also, the technologies illustrated in this specification or drawings can achieve two or more objects at the same time, and are considered to have technical usefulness when they achieve one of the purposes.

What is claimed is:

1. An electric device, comprising:
    a substrate on which an electronic component is mounted; and
    a metal plate to which the substrate is fixed, the metal plate including first bosses provided at positions corresponding to four corners of the substrate, a second boss provided inside a rectangle that connects the first bosses, and a slit provided adjacent to the second boss, the slit extending in non-parallel with any side of the rectangle,
    wherein the substrate is fixed to each of the first bosses with a first male screw, such that a rubber washer is sandwiched between the substrate and the first male screw, and
    wherein the substrate is fixed to the second boss with a second male screw, such that no rubber washer is sandwiched between the substrate and the second male screw.

2. The electric device according to claim 1, wherein the metal plate includes a plurality of the slits that extends in parallel with each other, such that the second boss is interposed between the slits.

3. The electric device according to claim 2, wherein the second boss adjacent to the slits is located in a middle of the rectangle that connects the first bosses corresponding to the four corners of the substrate.

4. The electric device according to claim 1, wherein a rib is provided on a back surface of a portion of the metal plate which is interposed between the slits, the rib having a height that increases in directions away from the second boss.

5. The electric device according to claim 1, wherein:
    the metal plate is connected at a periphery of the metal plate to side plates of a case of the electric device;
    the metal plate includes a third boss, and a U-shaped slit provided between the third boss and one of the side plates which is closest to the third boss, the U-shaped slit partially surrounding the third boss; and
    the substrate is fixed to the third boss with a third male screw.

6. The electric device according to claim 1, wherein:
    the metal plate includes a hole;
    a fourth boss is provided at an edge of the hole; and
    the substrate is fixed to the fourth boss with a fourth male screw.

7. The electric device according to claim 6, wherein a signal line passes through the hole.

* * * * *

UNITED STATES PATENT AND TRADEMARK OFFICE
CERTIFICATE OF CORRECTION

PATENT NO. : 10,524,374 B2  
APPLICATION NO. : 16/296730  
DATED : December 31, 2019  
INVENTOR(S) : Shoji Tsutsui et al.

Page 1 of 1

It is certified that error appears in the above-identified patent and that said Letters Patent is hereby corrected as shown below:

In the Specification

In Column 5, Line 9, after "11b,", delete "11e" and insert --11c--, therefor.

In Column 5, Line 12, after "11b,", delete "11e" and insert --11c--, therefor.

In Column 7, Line 44, after "14a,", delete "14b." and insert --14b,--, therefor.

In Column 8, Line 19, after "13b,", delete "14a." and insert --14a,--, therefor.

Signed and Sealed this  
Eighteenth Day of February, 2020

Andrei Iancu  
*Director of the United States Patent and Trademark Office*